(12) United States Patent
Kurihara

(10) Patent No.: US 7,518,413 B2
(45) Date of Patent: Apr. 14, 2009

(54) CURRENT DETECTION CIRCUIT

(75) Inventor: Shinji Kurihara, Ota (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 104 days.

(21) Appl. No.: 11/821,449

(22) Filed: Jun. 22, 2007

(65) Prior Publication Data

US 2008/0012607 A1    Jan. 17, 2008

(30) Foreign Application Priority Data

Jun. 28, 2006   (JP)   ............................. 2006-178741

(51) Int. Cl.
*H03K 5/22* (2006.01)
*H03K 5/153* (2006.01)

(52) U.S. Cl. ......................................... 327/77; 327/337

(58) Field of Classification Search .................. 327/63, 327/70, 77, 337
See application file for complete search history.

(56) References Cited

U.S. PATENT DOCUMENTS 5,467,034 A * 11/1995 Manlove et al. ................ 327/63
6,556,072 B1 * 4/2003 Nicollini et al. ............. 327/554
6,803,802 B2 * 10/2004 Bae et al. ..................... 327/337

FOREIGN PATENT DOCUMENTS

JP   2001-108712   4/2001

OTHER PUBLICATIONS

Patent Abstracts of Japan for Japanese Publication No. 2001-108712, Publication date Apr. 20, 2001 (1 page).

* cited by examiner

*Primary Examiner*—Quan Tra
(74) *Attorney, Agent, or Firm*—Osha · Liang LLP

(57) ABSTRACT

An upper end voltage and a lower end voltage of a current detection resistor Rs are supplied, via first and second switches S1 and S2, to one end of a main capacitor Ci. A reference voltage VREF is supplied, via a third switch S3, to the other end of the main capacitor Ci. The operational amplifier OP has a negative input terminal to which a voltage of the other end of the main capacitor Ci is supplied and a positive input terminal to which the reference voltage VREF is supplied. The circuit performs an operation for charging the main capacitor Ci with a voltage corresponding to a difference between the lower end voltage and the reference voltage in a state where the first and third switches S1 and S3 are turned on and the second switch S2 is turned off. The circuit obtains a voltage applied to the other end of the main capacitor Ci which is equivalent to a sum of the reference voltage VREF and a difference between the upper end voltage and the lower end voltage in a state where the first and third switches S1 and S3 are turned off and the second switch S2 is turned on. The circuit detects a voltage difference between two ends of the current detection resistor Rs based on a value obtained by the operational amplifier OP that subtracts the reference voltage VREF from the obtained voltage.

6 Claims, 5 Drawing Sheets

CURRENT DETECTION CIRCUIT

CROSS-REFEFRENCE TO RELATED APPLICATIONS

The entire disclosure of Japanese Patent Application No. 2006-178741 including the specification, claims, drawings and abstract is incorporated herein by reference.

BACKGROUND OF THE INVENTION

1. Field of the Invention

The present invention relates to a current detection circuit configured to detect current flowing through a current detection resistor based on a voltage difference between two ends of the current detection resistor.

2. Description of the Related Art

There is a conventional current detection circuit that includes a current detection resistor disposed in a current pathway and can detect current flowing through the current detection resistor based on a voltage difference between two ends of the current detection resistor. According to such a conventional circuit, if a resistance value of the current detection resistor is small, a voltage drop across the resistor becomes smaller. However, if the voltage drop across the current detection resistor is small, the current detection circuit may not be able to detect a voltage different between two ends of the current detection resistor. Especially, when the measured current is small, the current detection circuit may fail in detecting a small voltage difference.

As discussed in Japanese Patent Application Laid-Open No. 2001-108712, an operational amplifier can amplify a voltage difference between two ends of a current detection resistor and accordingly the current detection circuit can detect a relatively small voltage difference.

However, if the current detection circuit includes an operational amplifier, accuracy in current detection may deteriorate due to a noise component generated by resistors that determine an amplification rate of the operational amplifier. In general, the resistors generate thermal noise. The amount of generated thermal noise is equal to $Vn^2 = 4 \cdot k \cdot T \cdot B \cdot R$, where k represents the Boltzmann's constant, T represents the absolute temperature, B represents a frequency band width, and R represents a resistance value. Furthermore, an output of the operational amplifier includes an offset voltage and noise which may also deteriorate the accuracy in current detection.

If the current detection resistor has a larger resistance value to obtain a large voltage drop across the current detection resistor, i.e., if the accuracy in current detection is prioritized, loss in the circuit increases correspondingly. For example, a portable device may employ a current detection circuit to detect a battery current. In such a case, it is useful to use a smaller current detection resistor so that the capability of the battery can be maximized. Therefore, the current detection circuit for a portable device is required to limit the voltage drop across the current detection resistor and increase the accuracy in current detection.

SUMMARY OF THE INVENTION

The present invention relates to a technique using a switched capacitor configured to input a voltage drop across a current detection resistor to an operational amplifier. The circuit according to the present invention can accurately perform current detection and appropriately limit the effects of thermal noise generated by resistors.

To improve detection accuracy, the circuit according to the present invention can cancel an offset voltage of the operational amplifier.

Furthermore, the circuit according to the present invention can integrate a voltage drop across the current detection resistor in such a way that the ratio of noise decreases when the voltage drop (i.e., control object) is repeatedly added.

BRIEF DESCRIPTION OF THE DRAWINGS

The accompanying drawings, which are incorporated in and constitute a part of the specification, illustrate an embodiment of the invention and, together with the description, serve to explain the principles of the invention, in which.

DESCRIPTION OF PREFERRED EMBODIMENTS

Exemplary embodiments of the present invention will be described below with reference to attached drawings.

Figure 1:
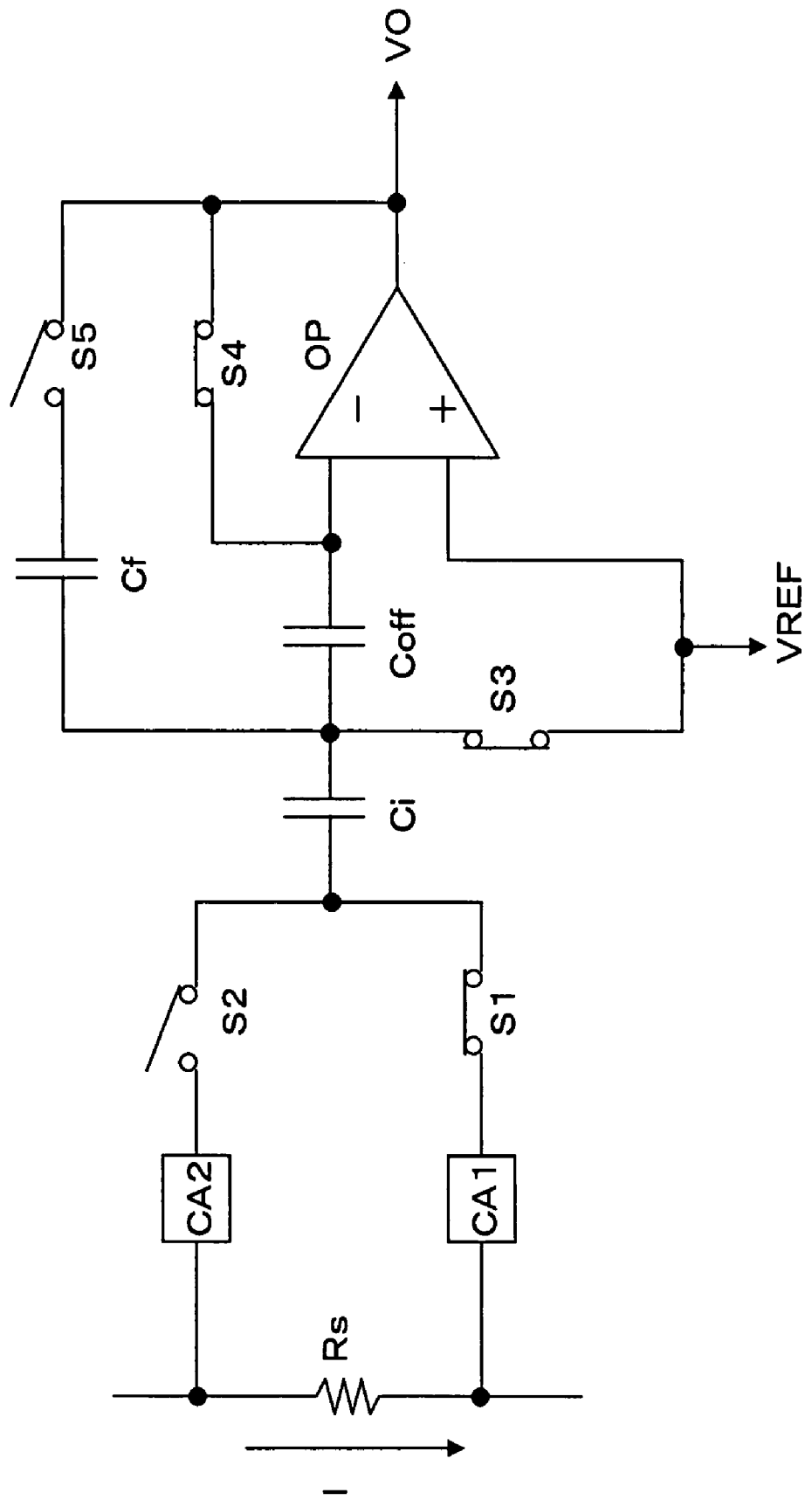
FIG. 1 illustrates a first switching state of a circuit according to an embodiment of the present invention.
Figure 2:
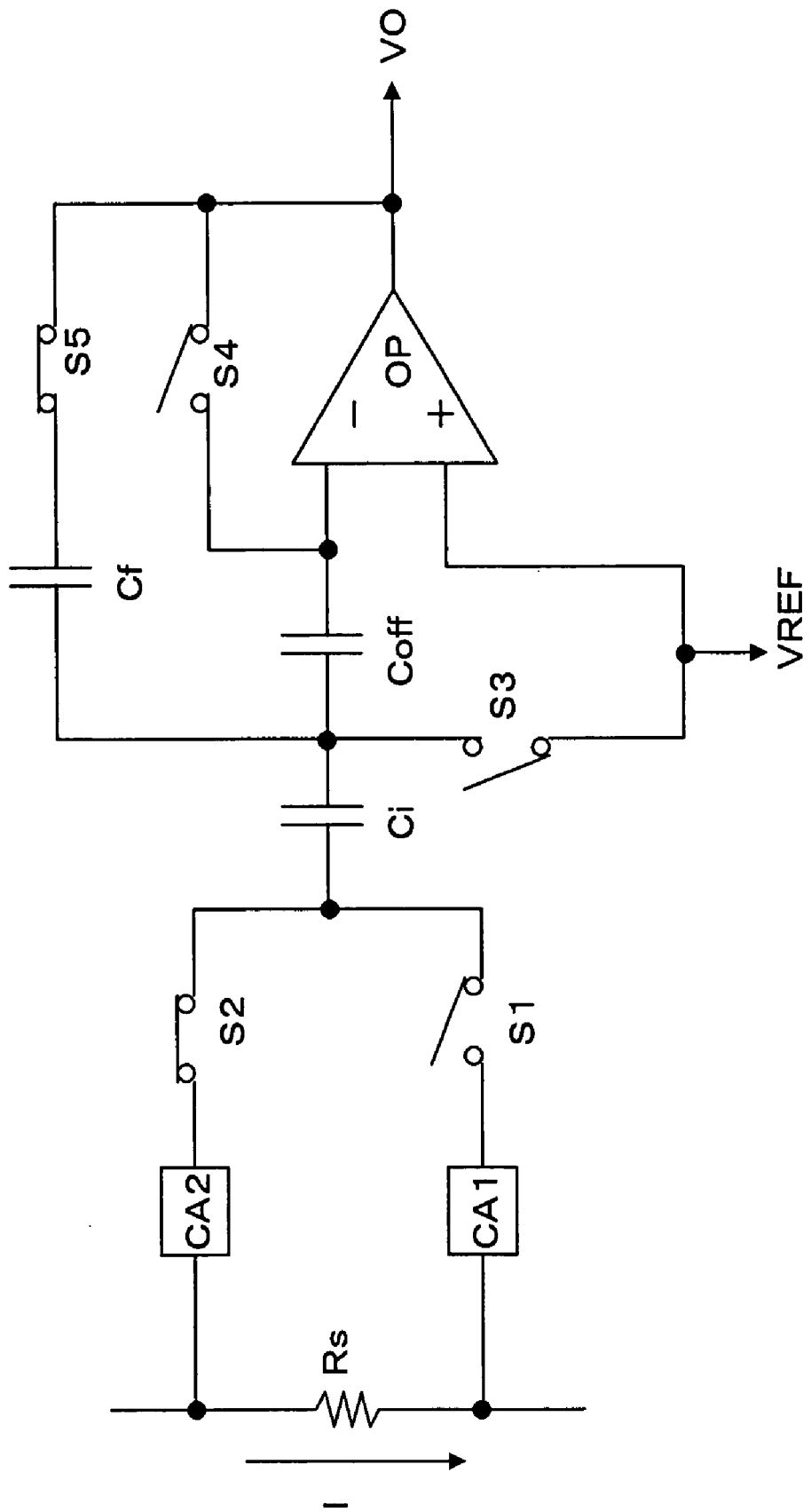
FIG. 2 illustrates a second switching state of the circuit according to the embodiment of the present invention.

FIGS. 1 and 2 illustrate a current detection circuit according to an embodiment of the present invention. FIG. 1 illustrates a first switching state of the circuit. FIG. 2 illustrates a second switching state of the circuit.

The current detection circuit is, for example, usable as a compact measuring device that detects a battery current of a portable device. The current detection circuit can effectively detect a voltage of about several 100 µV.

In FIGS. 1 and 2, current I flowing through a current detection resistor Rs is a detection object. When the current detection resistor Rs has a resistance value Rs, a voltage drop Rs I across the current detection resistor Rs appears as a voltage difference between two terminals of the current detection resistor Rs.

The current detection resistor Rs is an external element attached to a semiconductor integrated circuit (i.e. IC). The current detection resistor Rs has a lower end connected to a first terminal CA1 and an upper end connected to a second terminal CA2. The first terminal CA1 is connected, via a first switch S1, to one end of a main capacitor (first capacitor) Ci. Similarly, the second terminal CA2 is connected, via a second switch S2, to the one end of the main capacitor Ci.

The other end of the main capacitor Ci is connected via a third switch S3 to a reference power source VREF that supplies a reference voltage VREF. Furthermore, the other end of the main capacitor Ci is connected to one end of an offset compensation capacitor (second capacitor) Coff. The other end of the offset compensation capacitor Coff is connected to a negative input terminal (−) of an operational amplifier OP. A positive input terminal (+) of the operational amplifier OP is connected to the reference power source VREF. The negative input terminal of the operational amplifier OP is connected to one end of a fourth switch S4, and an output terminal of the operational amplifier OP is connected to the other end of the fourth switch S4.

A connecting point of the main capacitor Ci and the offset compensation capacitor Coff is connected to one end of an integral capacitor (third capacitor) Cf. The other end of the integral capacitor Cf is connected to one end of a fifth switch S5. The other end of the fifth switch S5 is connected to the output terminal of the operational amplifier OP. The operational amplifier OP can generate a detection signal VO.

The above-described circuit performs a switching operation according to which a group of the first, third, and fourth switches S1, S3, and S4 and another group of the second and fifth switches S2 and S5 are complementarily turned on and off. FIG. 1 illustrates a first switching state of the circuit where the first, third, and fourth switches S1, S3, and S4 are turned on while the second and fifth switches S2 and S5 are turned off. FIG. 2 illustrates a second switching state of the circuit where the first, third, and fourth switches S1, S3, and S4 are turned off while the second and fifth switches S2 and S5 are turned on.

The circuit according to the present embodiment alternately repeats the above-described first switching state and the second switching state to realize the following functions.

First, in the first switching state, a lower end voltage VCA1 of the current detection resistor Rs is supplied to one end of the main capacitor Ci. The reference voltage VREF is supplied to the other end of the main capacitor Ci. Accordingly, an electric charge stored in the main capacitor Ci is equal to $Qi1=(VCA1-VREF) \times Ci$.

On the other hand, the fourth switch S4 is in a turned-on state and connects the output terminal of the operational amplifier OP to the negative input terminal of the operational amplifier OP. The positive input terminal of the operational amplifier OP inputs the reference voltage VREF. Accordingly, the output terminal of the operational amplifier OP generates a voltage VREF+Voff which is equal to a sum of a rated output VREF of the operational amplifier OP and an offset voltage Voff. The negative input terminal of the operational amplifier OP is maintained at the electrical potential equal to VREF+Voff. The reference voltage VREF is supplied to a connecting point of the offset compensation capacitor Coff and the main capacitor Ci. Therefore, an electric charge stored in the offset compensation capacitor Coff is equal to $Qoff=Voff \times Coff$.

Next, in the second switching state, the first switch Si and the fourth switch S4 are turned off. There is no discharge route for the electric charge Qoff stored in the offset compensation capacitor Coff. Therefore, the electric charge Qoff is maintained in the offset compensation capacitor Coff. If a voltage is applied to a connecting point of the offset compensation capacitor Coff and the main capacitor Ci, the voltage is applied to the negative input terminal of the operational amplifier OP via the offset compensation capacitor Coff which stores the electric charge Qoff (i.e., holds the offset voltage Voff). Therefore, the negative input terminal of the operational amplifier OP can be regarded as a negative input terminal of an operational amplifier OP which does not include the offset voltage Voff.

Furthermore, in the second switching state, an upper end voltage VCA2 of the current detection resistor is supplied to one end of the main capacitor Ci. Accordingly, an electric charge stored in the main capacitor Ci is equal to $Qi2=(VCA2-VREF) \times Ci$. In this case, the electric charge difference $Qi1-Qi2$ stored in the main capacitor Ci has no discharge route other than a route including the integral capacitor Cf. Therefore, the electric charge $Qi1-Qi2$ is discharged to the integral capacitor Cf. Therefore, a voltage generated between two ends of the integral capacitor Cf is equal to $(VCA1-VCA2) Ci/Cf+Vn Ci/Cf$.

If the circuit repeatedly (n times) performs the above-described switching operation between the first switching state and the second switching state, the voltage generated between two ends of the integral capacitor Cf becomes $(VCA1-VCA2) n Ci/Cf+Vn\sqrt{n} Ci/Cf$. Namely, the circuit according to the present embodiment can amplify the voltage difference (i.e., voltage drop; VCA1-VCA2) between two ends of the current detection resistor Rs with an amplification ratio equal to n Ci/Cf. Meanwhile, the circuit according to the present embodiment amplifies the noise Vn of the operational amplifier OP with an amplification ratio equal to $\sqrt{n}Ci/Cf$. Accordingly, the operational amplifier OP can generate an output VO which has an increased S/N ratio having been improved by the degree corresponding to $\sqrt{n}$ (i.e., a ratio of n $Ci/Cf$ to $\sqrt{n} Ci/Cf$). The voltage drop (VCA1-VCA2), i.e., a detection object, is a constant signal and can be directly added, while the noise Vn is random in phase and synergistically summed up. This is the reason why the circuit according to the present embodiment can bring about the above-described effect of improving the S/N ratio.

As described above, the circuit according to the present embodiment, including switches and capacitors for transporting the voltage, can detect a voltage difference between two ends of the current detection resistor Rs and appropriately limit the effect of thermal noise generated from resistors. Furthermore, the circuit according to the present embodiment charges the offset compensation capacitor Coff with the offset voltage Voff so that an output of the operational amplifier OP does not include the offset voltage Voff. Moreover, the circuit according to the present embodiment causes the integral capacitor Cf to store an electric charge corresponding to the integration of the voltage drop across the current detection resistor Rs performed repeatedly (n times) and, as a result, can improve the S/N ratio and generate an output amplified correspondingly (n times).

Other Configurations

As another embodiment of the present invention, the above-described circuit embodiment may not include any one of the offset compensation capacitor Coff, the fourth switch S4, the integral capacitor Cf, and the fifth switch S5.

For example, if the circuit does not include the offset compensation capacitor Coff, a connecting point of the main capacitor Ci and the third switch S3 is directly connected to the negative input terminal of the operational amplifier OP. The circuit pathway including the fourth switch S4 extending from the output terminal to the negative input terminal of the operational amplifier OP can be removed. The circuit pathway including the integral capacitor Cf and the fifth switch S5 can be also removed.

In this case, in the first switching state, one end of the main capacitor Ci has an electrical potential of VCA1 and the other end of the main capacitor Ci has an electrical potential of VREF. If the operation state of the circuit changes from the first switching state to the second switching state, the electrical potential of one end of the main capacitor Ci changes from VCA1 to VCA2. Accordingly, the electrical potential of the other end of the main capacitor Ci becomes VREF+(VCA2-VCA1). The operational amplifier OP generates an output equal to (VCA2-VCA1) However, this circuit arrangement cannot cancel the offset voltage Voff of the operational amplifier OP.

As another embodiment, the circuit pathway including the integral capacitor Cf and the fifth switch S5 can be removed, although the circuit includes the offset compensation capacitor Coff and the fourth switch S4. According to this circuit arrangement, in the first switching state, the offset compensation capacitor Coff is charged with the offset voltage Voff. If an electrical potential of the other end of the main capacitor Ci is equal to VREF+(VCA2−VCA1) in the second switching state, the operational amplifier OP can generate an output which does not include the offset voltage Voff.

Furthermore, as another embodiment, the offset compensation capacitor Coff and the fourth switch S4 can be removed, although the circuit includes the integral capacitor Cf and the fifth switch S5. This circuit arrangement can integrate the output as described above, although the offset may remain.

Figure 3:
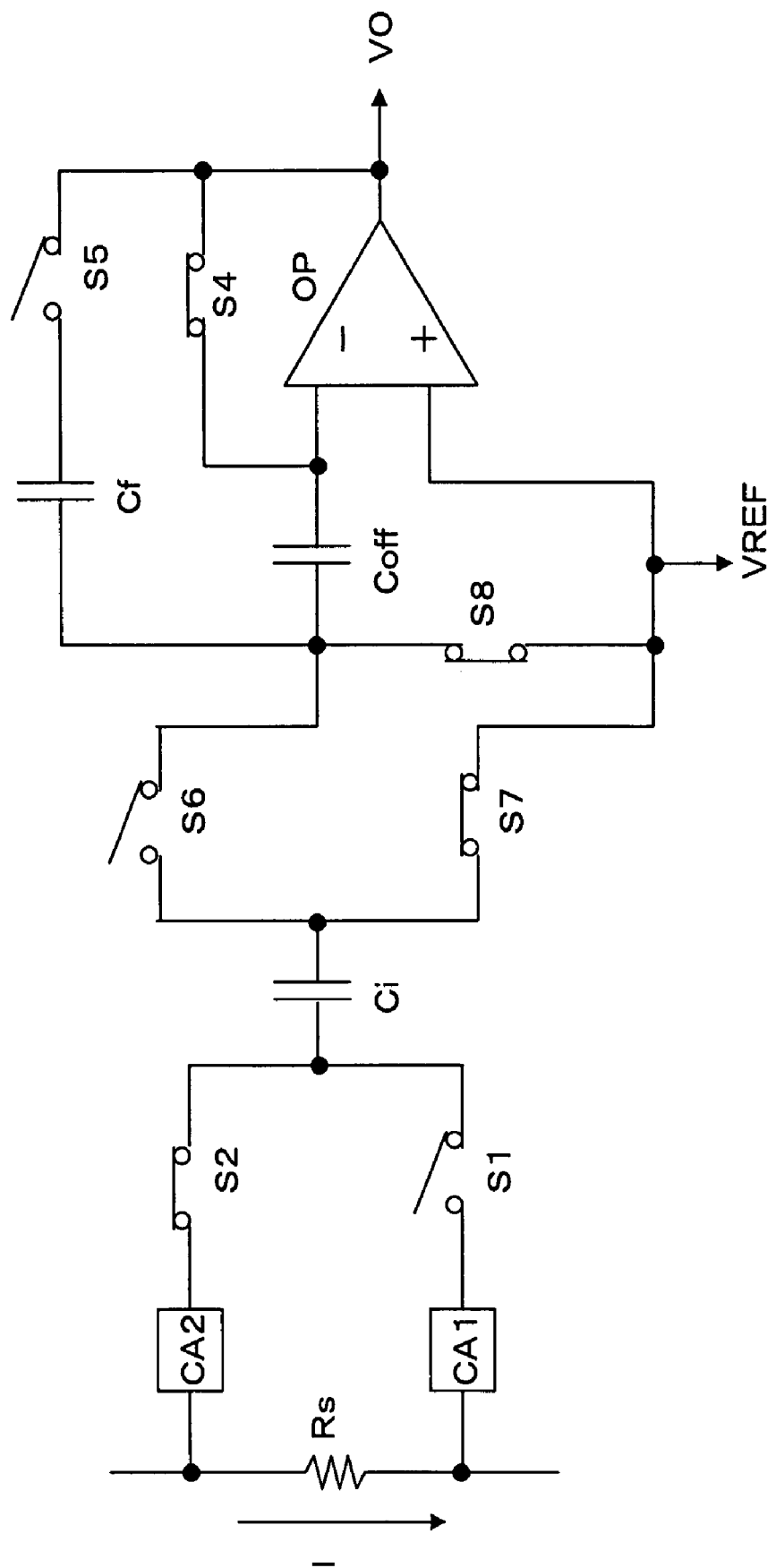
FIG. 3 illustrates a first switching state of a circuit according to a modified embodiment of the present invention.
Figure 4:
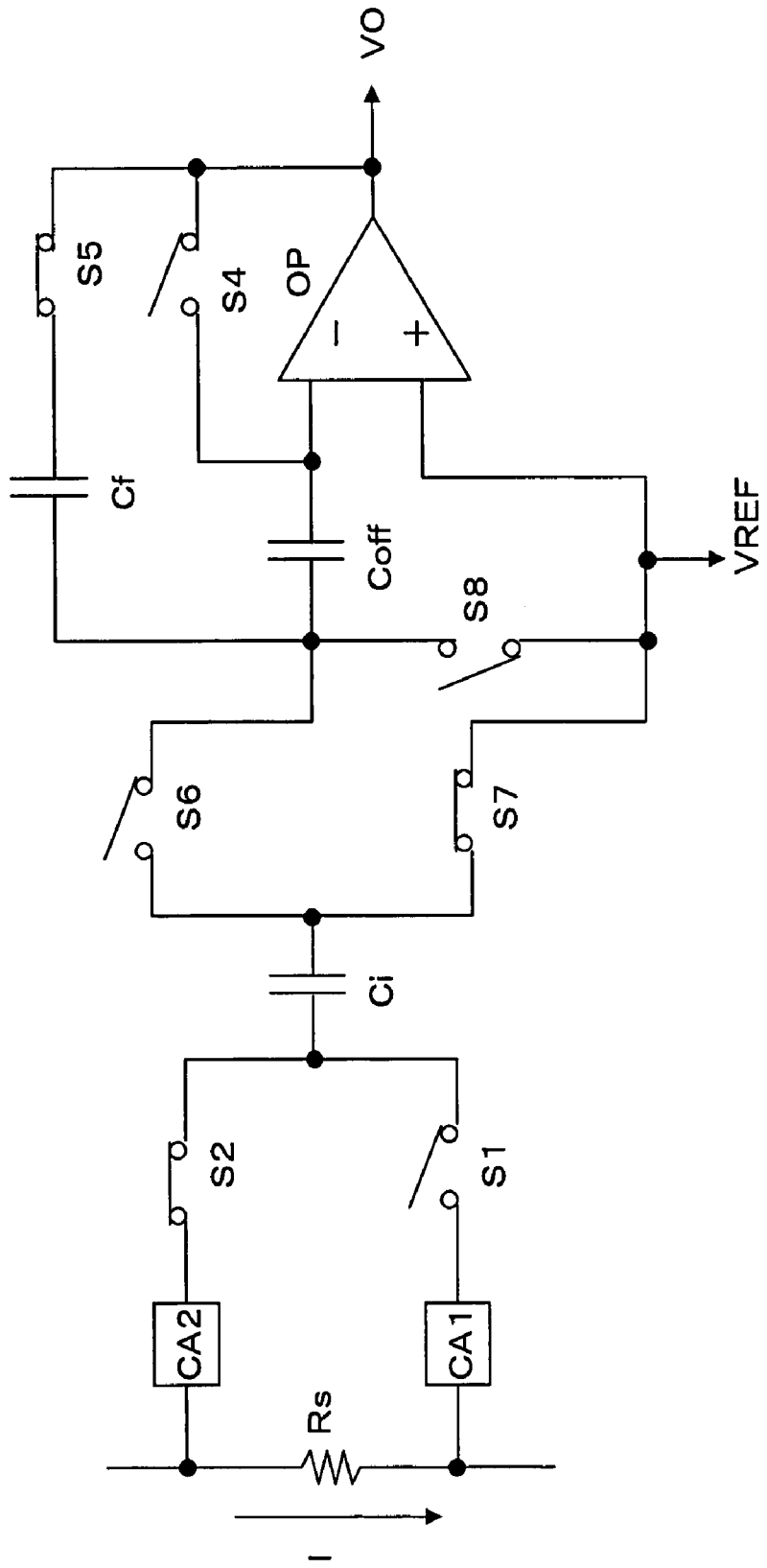
FIG. 4 illustrates a second switching state of the circuit according to the modified embodiment of the present invention.
Figure 5:
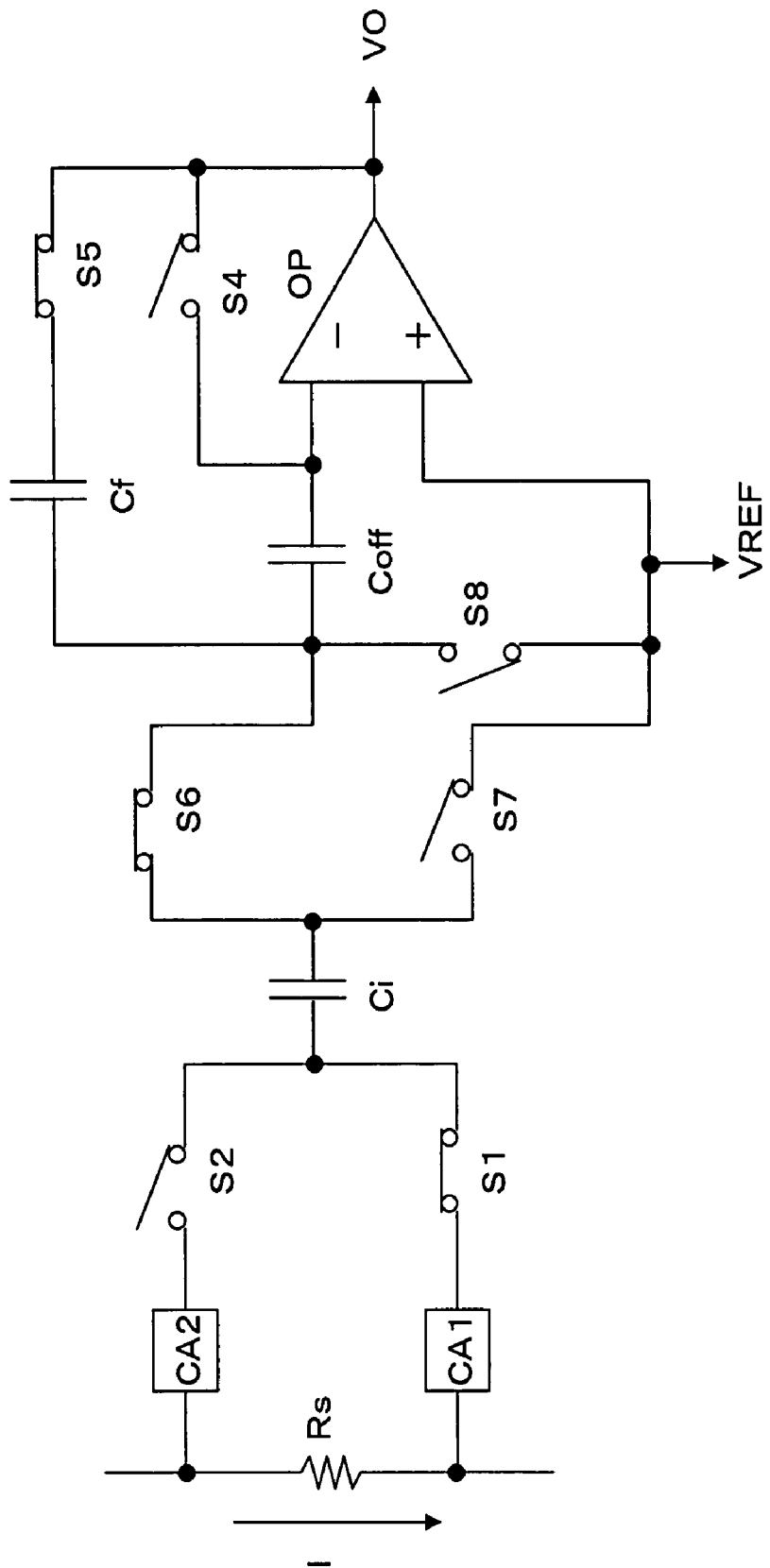
FIG. 5 illustrates a third switching state of the circuit according to the modified embodiment of the present invention.

FIGS. 3 to 5 illustrate a modified embodiment of the present embodiment. The modified embodiment includes a sixth switch S6 which is newly added, and replaces the third switch S3 with a seventh switch S7 and an eighth switch S8. More specifically, the other end of the main capacitor Ci, which is not connected to the first switch S1 and the second switch S2, is connected via the sixth switch S6 to the offset compensation capacitor Coff. Furthermore, two ends of the sixth switch are connected via the seventh switch S7 and the eighth switch S8 to the reference power source VREF. One end of the integral capacitor Cf is connected to a connecting point of the sixth switch S6 and the offset compensation capacitor Coff. The seventh switch S7 is functionally equivalent to the above-described third switch S3 that can store electric charge in the main capacitor Ci. The eighth switch S8 is functionally equivalent to the third switch S3 that can charge the offset compensation capacitor Coff.

According to the above-described modified embodiment, in a first switching state illustrated in FIG. 3, the fifth and sixth switches S5 and S6 are in a turned-off state and the eighth and fourth switches S8 and S4 are in a turned-on state. In this condition, the output terminal of the operational amplifier OP is directly connected to the negative input terminal of the operational amplifier OP. The reference voltage VREF is input to the positive input terminal of the operational amplifier OP. The operational amplifier OP generates an output equal to VREF+Voff. The negative input terminal of the operational amplifier OP is maintained at the electrical potential equal to VREF+Voff. The reference voltage VREF is supplied to the connecting point between the offset compensation capacitor Coff and the main capacitor Ci. Therefore, an electric charge stored in the offset compensation capacitor Coff is equal to Qoff=Voff×Coff.

In FIG. 3, the second switch S2 is in a turned-on state and the seventh switch S7 is in a turned-on state. Therefore, the main capacitor Ci is charged with a difference voltage between the voltage VCA2 and the reference voltage VREF. It should however be noted that the second and seventh switches S2 and S7 can be maintained in a turned-off state.

Next, in a second switching state illustrated in FIG. 4, the second and seventh switches S2 and S7 are in a turned-on state and the eighth and fourth switches S8 and S4 are in a turned-off state. Therefore, a difference voltage between the voltage VCA2 and the reference voltage VREF is applied to the main capacitor Ci and an electric charge stored in the main capacitor Ci is equal to (VCA2−VREF)×Ci. Although the fifth switch S5 in FIG. 4 is in a turned-on state for the purpose of facilitating the following operation, the fifth switch S5 can be maintained in a turned-off state.

Next, in a third switching state illustrated in FIG. 5, the first, fifth, and sixth switches S1, S5, and S6 are in a turned-on state, while the second and seventh switches S2 and S7 are in a turned-off state. The electric charge stored in the integral capacitor Cf is equal to (VCA2−VCA1)×Ci which represents a difference between the electric charge stored in the main capacitor Ci illustrated in FIG. 4 and the electric charge stored in the main capacitor Ci illustrated in FIG. 5.

Accordingly, if the circuit alternates the second switching state of FIG. 4 and the third switching state of FIG. 5 repeatedly (n times), the circuit can obtain an amplified output equivalent to n times the electrical potential difference between VCA1 and VCA2.

According to the above-described circuit arrangement, in the second switching state and the third switching state, the fourth and eighth switches S4 and S8 are maintained in a turned-off state while the fifth switch S5 is maintained in a turned-on state. Therefore, the circuit can stably perform the above-described integration operation repeatedly (n times). Furthermore, the circuit integrates the potential difference between VCA1 and VCA2 after completing a process of charging the offset compensation capacitor Coff with the offset voltage of the operational amplifier OP. Thus, the circuit can stably perform the entire operation.

What is claimed is:

1. A current detection circuit comprising:
a current detection resistor configured to generate a voltage between two ends which corresponds to current flowing through the resistor;
a first capacitor having one end configured to input an upper end voltage and a lower end voltage of the current detection resistor which are supplied via first and second switches;
a third switch configured to selectively supply a reference voltage to the other end of the first capacitor; and
an operational amplifier configured to input a voltage corresponding to an electrical potential of the other end of the first capacitor via a negative input terminal, input the reference voltage via a positive input terminal, and generate an output representing a difference between two inputs, wherein
the circuit performs an operation for charging the first capacitor with a voltage corresponding to a difference between the lower end voltage and the reference voltage in a state where the first and third switches are turned on and the second switch is turned off, and obtaining a voltage applied to the other end of the first capacitor which is equivalent to a sum of the reference voltage and a difference between the upper end voltage and the lower end voltage in a state where the first and third switches are turned off and the second switch is turned on, wherein
the circuit detects a voltage difference between the two ends of the current detection resistor based on a value obtained by the operational amplifier that subtracts the reference voltage from the obtained voltage.

2. The current detection circuit according to claim 1, further comprising:
a second capacitor disposed between the other end of the first capacitor and the negative input terminal of the operational amplifier; and
a fourth switch configured to selectively connect an output terminal of the operational amplifier and the negative input terminal of the operational amplifier, wherein
the circuit turns the fourth switch and the first switch on and off simultaneously and charges the second capacitor with an offset voltage of the operational amplifier in a state where the fourth switch is turned on, and
the circuit compensates an offset in the output of the operational amplifier by inputting a voltage equivalent to a sum of an offset voltage of the operational amplifier and a voltage of the other end of the first capacitor to the negative input terminal of the operational amplifier in a state where the fourth switch is turned off.

3. The current detection circuit according to claim 1, further comprising:
   a third capacitor having one end connected to the other end of the first capacitor; and
   a fifth switch having one end connected to the other end of the third capacitor and the other end connected to an output terminal of operational amplifier, wherein
   the third capacitor repeatedly stores an electric charge corresponding to a voltage drop across the current detection resistor in a state where the fifth switch is turned on, and
   the circuit obtains an output by integrating input conversion noise of the operational amplifier relative to the electric charge corresponding to the voltage drop across the current detection resistor, while reducing a rate of the input conversion noise.

4. The current detection circuit according to claim 1, further comprising:
   a sixth switch disposed between the other end of the first capacitor and the negative input terminal of the operational amplifier, to selectively input a voltage corresponding to an electrical potential of the other end of the first capacitor to the negative input terminal, wherein
   the circuit turns the sixth switch off if the third switch is in a turned-on state and turns the sixth switch on if the third switch is in a turned-off state.

5. The current detection circuit according to claim 4, further comprising:
   a second capacitor disposed between the sixth switch and the negative input terminal of the operational amplifier;
   a fourth switch configured to selectively connect an output terminal of the operational amplifier and the negative input terminal of the operational amplifier; and
   an eighth switch configured to selectively supply the reference voltage to a connecting point of the sixth switch and the second capacitor, wherein
   the circuit turns the fourth switch on in a state where the sixth switch is turned off to charge the second capacitor with an offset voltage of the operational amplifier, and
   the circuit compensates an offset in the output of the operational amplifier by inputting a voltage equivalent to a sum of the offset voltage of the operational amplifier and a voltage of the other end of the first capacitor to the negative input terminal of the operational amplifier in a state where the fourth switch is turned off.

6. The current detection circuit according to claim 5, further comprising:
   a third capacitor having one end connected to a connecting point of the sixth switch and the second capacitor; and
   a fifth switch having one end connected to the other end of the third capacitor and the other end connected to an output terminal of operational amplifier, wherein
   the third capacitor repeatedly stores an electric charge corresponding to a voltage drop across the current detection resistor in a state where the fifth switch is turned on, and
   the circuit obtains an output by integrating input conversion noise of the operational amplifier relative to the electric charge corresponding to the voltage drop across the current detection resistor, while reducing a rate of the input conversion noise.

* * * * *